United States Patent [19]

Ransom et al.

[11] 4,410,815
[45] Oct. 18, 1983

[54] GALLIUM ARSENIDE TO EMITTER COUPLED LOGIC LEVEL CONVERTER

[75] Inventors: Stephen A. Ransom, Huntington Valley; Tedd K. Stickel; Joseph B. Tomei, both of Chalfont, all of Pa.

[73] Assignee: Sperry Corporation, New York, N.Y.

[21] Appl. No.: 305,320

[22] Filed: Sep. 24, 1981

[51] Int. Cl.³ .......................................... H03K 19/092
[52] U.S. Cl. ................................... 307/475; 307/264; 307/448
[58] Field of Search ............... 307/264, 455, 467, 475, 307/304, 448

[56] References Cited

U.S. PATENT DOCUMENTS 3,716,722  2/1973  Bryant et al. ........................ 307/455
4,237,388  12/1980 Nokubo et al. ....................... 307/475

*Primary Examiner*—John Zazworsky
*Attorney, Agent, or Firm*—John B. Sowell; Thomas J. Scott; Marshall M. Truex

[57] ABSTRACT

A high speed gallium arsenide (GaAs) integrated circuit is provided which converts GaAs input or source signals to voltage levels for directly driving emitter coupled logic (ECL) circuits. The high speed GaAs level converter comprises a level shifting network at the input, two stages of differential amplification and a novel source follower output stage.

12 Claims, 4 Drawing Figures

4,410,815

GALLIUM ARSENIDE TO EMITTER COUPLED LOGIC LEVEL CONVERTER

BACKGROUND OF THE INVENTION

1. Field of the Invention

This invention is related to a level converter and more particularly, relates to semiconductor circuitry which is provided on gallium arsenide (GaAs) as an integrated circuit for converting GaAs input logic signals to voltage levels which are applied to transmission lines for directly driving emitter coupled logic (ECL) circuits.

2. Related Applications

This invention is related to our co-pending "High-Gain Stabilized Converter", Ser. No. 264,898, filed 18 May 1981. This co-pending application describes a gallium arsenide converter employing a differential amplifier for converting ECL logic input signals to voltage levels capable of driving GaAs circuitry.

3. Description of the Prior Art

Numerous different types or families of integrated circuits are commercially available. Manufacturers of integrated circuits usually produce families of devices which are completely compatible with each other. Many families of integrated circuits have characteristics which are so similar that they permit the designers to mix families in the same system to obtain optimum performance.

It is not uncommon for manufacturers of families of integrated circuits to produce devices which are incompatible and in which the characteristics of the incompatible families of devices are not matched. Accordingly, some form of signal level conversion is required to assure that the logic signals from one of the families are properly sensed and processed for use in the other family.

More than one type of problem can arise when two different types of logic families are being connected in the same system. The power supply levels may be different and the logic voltage swings at the input and output may also be different. The signals being processed may also require reshaping, amplification and/or attenuation for proper use and synchronization.

When the conversion or translation of signals is implemented in high speed logic families, it is also important that the conversion logic does not create an inordinate time delay, otherwise, the reason for using a high speed logic family can be defeated by time delays at the interface converter.

These problems are understood by logic designers and have been considered in typical translators and converters sold by numerous semiconductor houses including Motorola, Inc. for interfacing ECL with transistor-transistor logic (TTL). These commercially available translators and converters cannot be used or modified for use with ECL and GaAs logic without encountering some of the afore-mentioned problems as well as the problems of stability, switching time and ringing which occur with high speed logic circuits. It would be desirable to avoid or eliminate the known and understood problems of translation and/or conversion when adapting a conversion unit for GaAs to ECL. Further, it would be highly desirable to provide the conversion circuitry as part of the output circuitry of the high speed logic and to provide this logic as part of an integrated circuit without the requirements of additional discrete components which would slow down the converter.

It would also be desirable if the converter or translation circuit has as few stages as possible and that they be free of generated noise and also be compensated against age degradation and temperature variation. Further, it would be desirable that the translating or compensating network be free from variations due to power supply voltages.

SUMMARY OF THE INVENTION

It is a principal object of the present invention to provide a GaAs to ECL lever converter.

It is another principal object of the present invention to provide a novel GaAs driving circuit which is capable of driving an ECL load and appears to the ECL load to be an ECL driver.

It is another object of the present invention to provide a novel level conversion circuit in GaAs which emulates the operation of an ECL driving circuit.

It is another object of the present invention to provide a novel level conversion circuit which can be implemented on a single integrated circuit chip.

It is another object of the present invention to provide a novel level conversion circuit which is fast acting and optimizes the performance of GaAs to ECL level conversion.

It is yet another object of the present invention to provide a novel GaAs to ECL level converter which minimizes the power requirements.

According to these and other objects of the present invention, there is provided a novel level conversion circuit adapted to be made integral with a GaAs circuit chip. The level conversion is provided by a novel differential amplifier having an output which is connected to a novel output driver. The novel output driver is connected to an ECL load and appears to the ECL load to be the emulation of an ECL driver.

DESCRIPTION OF THE PREFERRED EMBODIMENTS

The afore-mentioned related application Ser. No. 264,898 describes an ECL to GaAs level converter in which the input signals were not of sufficient amplitude to drive standard GaAs circuits. The purpose of the differential amplifier was to provide temperature stabilized voltage gain.

In the present application a GaAs to ECL level converter is provided in which the input signals are already standard GaAs logic levels of −0.4 volts to −1.8 volts which are to be converted to signals of higher amplitude; that is zero volts to −2.7 volts for driving a power gain voltage follower transistor which is capable of driving a 50 ohm transmission line load.

Figure 1:
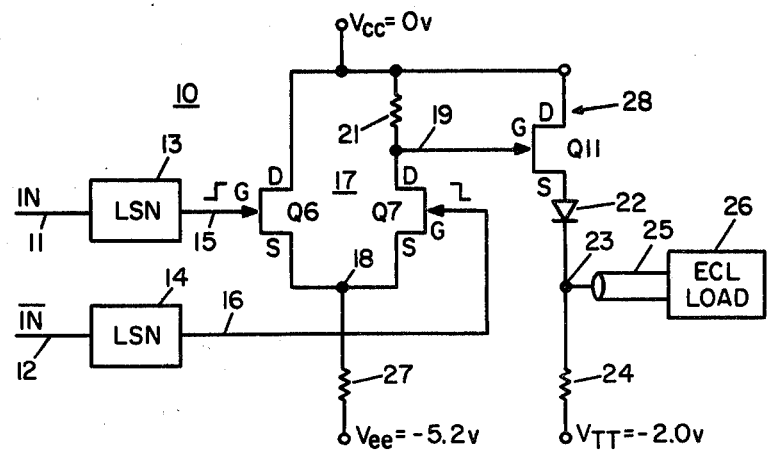
FIG. 1 is a schematic diagram showing a simplified preferred embodiment GaAs to ECL level converter.

Refer now to FIG. 1 showing a simplified preferred embodiment level converter 10. GaAs logic level signals are presented as high level signals on input line 11 and as low level signals on input line 12. These high and low level signals are processed through the level shifting networks 13 and 14 to provide the shifted level logic signals on lines 15 and 16 which are applied to the differential amplifier 17 for amplification. When a high level signal is applied on line 15 to the gate of transistor Q6, the source of Q6, the node 18 and the source of Q7 go high such as to turn OFF transistor Q7. When Q7 turns OFF, the drain of Q7 and the output line 19 go to the voltage source level of Vcc because there is no current drain. The pull-up load resistor 21 is provided so that the line 19 pulls up to Vcc. When the voltage Vcc is applied to the gate of transistor Q11, very little current is required due to the fact that Q11 is a depletion mode MESFET. When the gate of Q11 is at zero volts, Q11 is hard ON and the source of Q11 is at approximately −0.1 volts. The drop across diode 22 is approximately 0.7 volts which places the output node 23 at approximately −0.8 volts which is representative of a logic high for ECL circuitry. The logic high of −0.8 volts is applied to the high side of the termination resistor 24 and the other side of the termination resistor 24 is held at the termination voltage of −2.0 volts. The logic signal is transmitted via a coaxial transmission line 25 to the ECL load circuitry 26 as a standard input accepted by ECL circuitry.

When a low signal is applied at input line 11 and a high signal is applied at input line 12, the shifted voltage levels are applied to the gates of transistors Q6 and Q7 respectively. The high signal on the gate of Q7 causes Q7 to conduct and Q6 to turn OFF. This pulls the output line 19 down to a low logic level of −2.7 volts. When the low logic level of −2.7 volts on line 19 is applied to the gate of transistor Q11, which is already ON, it causes the source of Q11 to drop to at least −1.2 volts so that the output node 23 Will go to at least −1.6 volts representative of a logic low. Differential amplifier 17 is supplied with a voltage source Vcc of zero volts. Differential amplifier 17 is also supplied with a low reference voltage Vee of approximately −5.2 volts which is applied to the node 18 through the common source impedance or resistor 27.

Having explained the operation of the converter 10, it will be understood that the novel branch circuit 28 comprising transistor Q11 and diode 22 completely emulates the output which is derived from an ECL bipolar output driver. The ECL load 26 is unable to distinguish between the novel converter output and the output of a standard ECL driver. It will now be understood that the converter of the present invention combined with the converter of the related application Ser. No. 264,898 will permit the removal of ECL integrated circuits in a standard system and will permit the substitution of high speed GaAs circuits without board modifications in the system.

Figure 2:
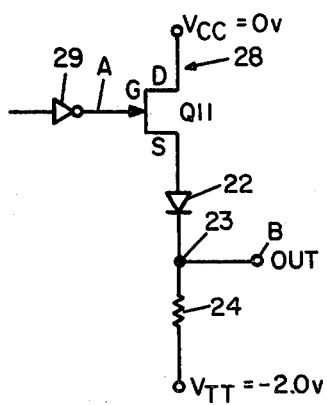
FIG. 2 is a schematic diagram of a standard GaAs inverter driving the output stage of FIG. 1.

Refer now to FIG. 2 showing output branch or stage 28 being driven by a standard GaAs inverter driver. A standard GaAs inverter 29 which is driving no D.C. load will swing between the high and low voltage levels of zero and −1.7 volts. The transistor Q11 is a depletion mode device which is connected as a source follower transistor and requires a gate voltage which is one device threshold more negative than its source to turn OFF. Thus, when the voltage on line 23 is in an ECL logic low condition (equal to or less than −1.6 volts), then the source of transistor Q11 will be equal to or less than −1.0 volts. If the gate is to be one device threshold more negative than its source, this requires that the gate of source follower transistor Q11 be equal to or less than −2.5 volts when the device threshold is −1.5 volts. Since the voltage output from inverter 29 on line A has been defined as swinging between zero volts and −1.7 volts, it can be seen that the requirement for a gate voltage of at least −2.5 volts cannot be met using a standard GaAs inverter.

Figure 3:
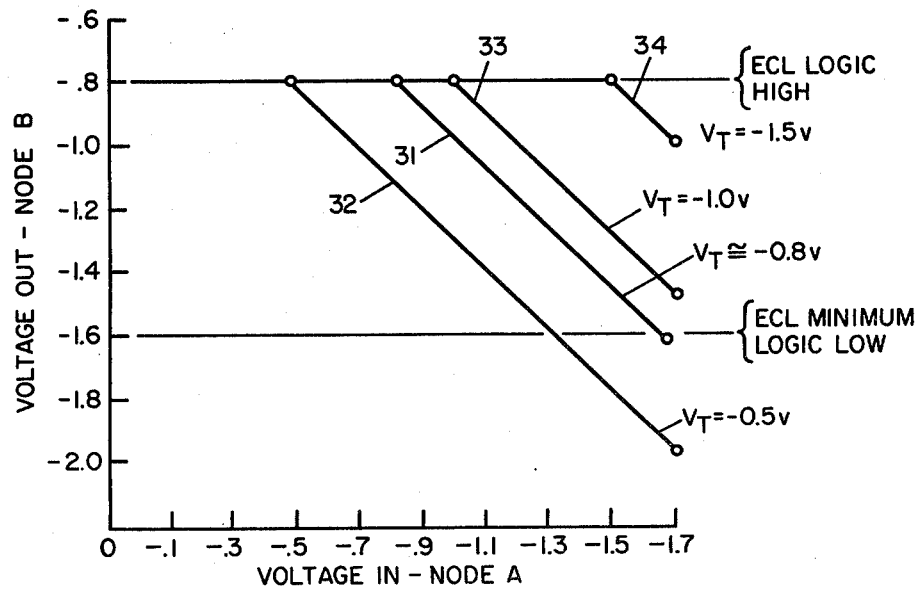
FIG. 3 is a transfer function diagram showing the characteristics of the output stage of FIG. 2 for various device threshold voltages.

Refer now to FIG. 3 showing a transfer function diagram of the characteristics of the output stage 28 of FIG. 2 for various GaAs device threshold voltages. The abscissa of FIG. 3 shows the voltages at node A as an output from inverter 29, which as previously defined swings between zero and −1.7 volts. When the voltage on node A is in the range of −1.7 volts, a logic low can only be obtained at the output node B when the device threshold is approximately −0.8 volts or greater as shown by curve 31. If the voltage threshold ($V_T$) is greater tha −0.8 volts, the output on node B is in the logic low range for ECL inputs as shown by waveform 32. If the device threshold ($V_T$) becomes more negative than −0.8 volts, it will be seen that the waveforms 33 and 34 are incapable of reaching the ECL minimum logic low. Since the range of device threshold voltages for standard GaAs processing varies between −1.5 volts and −0.5 volts, it will be seen that there is a large range of inoperability as represented by waveforms 33 and 34 etc.

Having explained why the GaAs inverter 39 creates a situation of inoperability, it will be appreciated that the differential amplifier 17 shown and described in FIG. 1 overcomes these problems.

Figure 4:
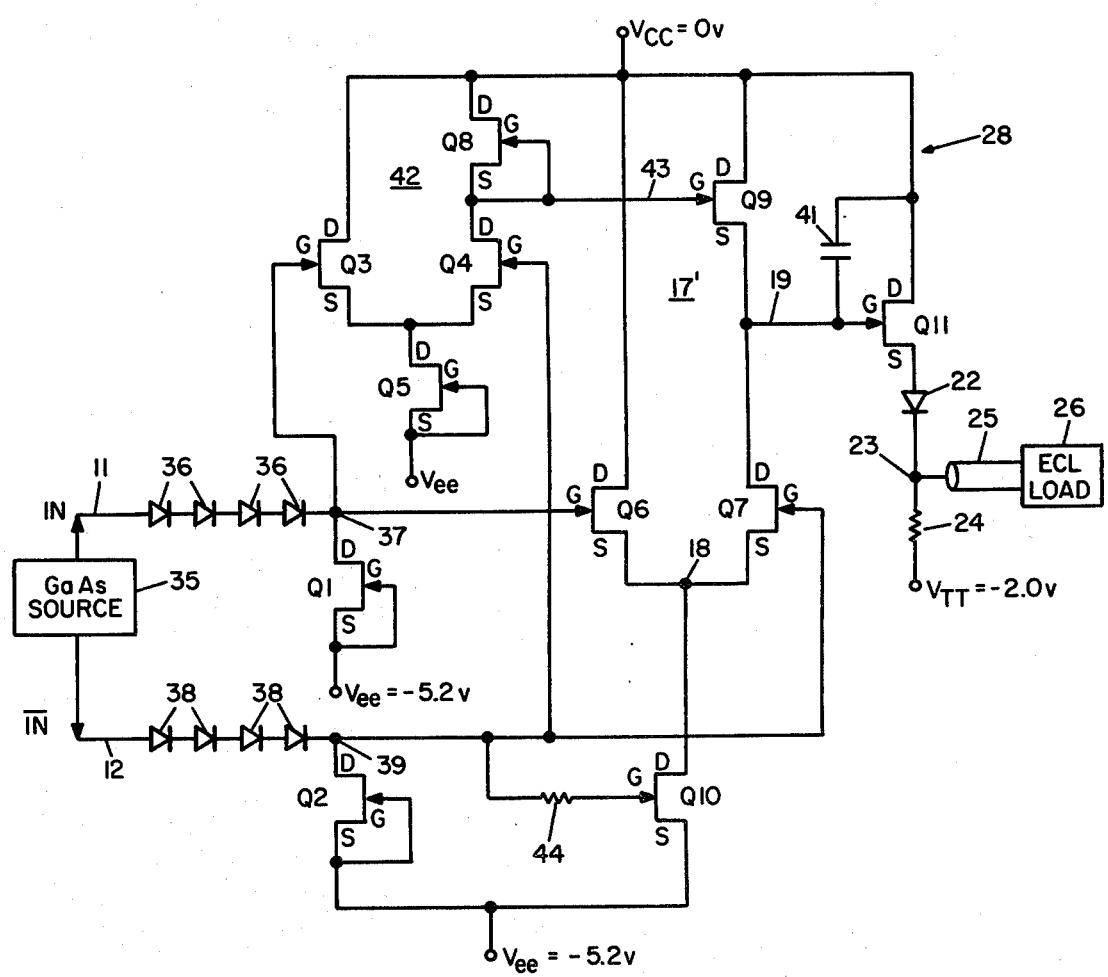
FIG. 4 is a schematic diagram of an enhanced and preferred embodiment GaAs to ECL level converter.

Refer now to FIG. 4 showing an enhanced and improved embodiment of the FIG. 1 converter 10. The GaAs source 35 is representative of any GaAs circuitry in which the output signals on lines 11 and 12 are out of phase and reverse representing the low logic and high logic condition previously described as −0.4 volts and −1.8 volts. When the high logic level on line 11 is at the −0.4 volt condition, level shifting diodes 36 bring this voltage down to −3.1 volts at node 37. A current source pull-down transistor Q1 is connected between node 37 and the low reference voltage Vee. Regardless of whether the signal on line 11 is a high logic level or a low logic level there will be a current flow through level shifting diodes 36 and transistor Q1, thus providing a level shifting network as shown in FIG. 1 at block 13. I similar manner, the logic low on line 12 is shifted by the level shifting diodes 38 and the current source pull-down transistor Q2 which is connected to the low reference voltage Vee. It will now be understood that the two level shifting networks comprising diodes 36 and transisor Q1 and diodes 38 and transistor Q2 are identical level shifting networks. Since the two Gas level shifting networks are made by the identical process, they are both temperature and process compensated relative to each other. Neither voltage node 37 or node 39 of the two level shifting networks are fixed but are capable of change without effecting the operation of differential amplifier 17'. Thus, a voltage rise or drop at node 37 is tracked or followed at node 39. The identical rise or drop in voltage is applied to the gates of the input transistors Q6 and Q7 as common mode signals so that differential amplifier 17' maintains the same output level on output line 19.

When node 37 is in its high logic condition, it is at approximately −3.1 volts and the node 39 is at approximately −4.6 volts. The −3.1 volt condition at the gate of transistor Q6 turns Q6 ON causing the node 18 and the drain of transistor Q10 to be driven high enough to turn the transistor Q7 OFF. When the voltage on lines 11 and 12 are reversed such that a high voltage condition appears on line 12, a high logic condition appears at node 39 which is applied to the gate of transistor Q7 turning it ON. When transistor Q7 turns ON, it permits a current flow through transistor Q9 so as to pull output line 19 to a lower voltage condition than before. The low logic condition on line 19 has been described hereinbefore as being approximately −2.7 volts and the high logic condition as previously been described as being approximately zero volts. When the high logic condition appears on output line 19 to the gate of source follower transistor Q11, the transistor Q11 is turned ON. When the low logic condition appears on output line 19 and the gate of source follower transistor Q11, the transistor Q11 is turned OFF. The low logic condition and high logic conditions appearing on output line 19 are translated into high logic and low logic voltage condition at node 23 of −0.8 volts and −1.6 volts max. These logic levels are identical to the logic levels required for driving an ECL logic load 26 through a transmission line 25. It will be understood that the standard matching transmission line for an ECL load 26 is approximately 50 ohms and that termination resistor 24 will be preferably 50 ohms. However, the novel output stage 28 is capable of driving other matched impedance loads and transmission lines such as a 75 ohm coax line by changing the termination resistor 24 to 75 ohms. In order to drive the termination resistor which is attached to node 23 as well as the external parasitic capacitance the transmission line and load 26, the size of source follower transistor Q11 is made large enough to handle the afore-mentioned load appearing at node 23. There is a large inherent parasitic capacitance 41 formed at the gate of transistor Q11. In order to obtain high speed switching for rapidly charging and discharging parasitic capacitor 41, it was necessary to increase the size and capacity of the transistors Q6, Q7, Q9 and Q10 of differential amplifier 17'. The increase in the size of the transistors of differential amplifier 17' causes an increase in the power requirements for the differential amplifier. In order to minimize the power requirements for differential amplifier 17', a differential amplifier 42 is provided. When the output of differential amplifier 42 is in a high condition, the gate of current source load transistor Q9 is driven in a fashion so as to maximize the charging current for the low to high transition on line 19. When the output from differential amplifier 42 on line 42 to the gate of current source load transistor Q9 is going from a high to a low transition, then the dc or standby current flowing in transistor Q9 will be minimized.

When line 43 from differential amplifier 42 is in a low state, the transistor Q9 is placed in a reduced current flow condition. When line 43 is low, it is desirable to charge parasitic capacitor 41 as fast as possible and this is accomplished by increasing the current flow through controlled current source transistor Q10. The low condition on output line 43 from differential amplifier 42 is idicative of a low at node 37 and a high at node 39. The high condition at node 39 is applied to the gate of transistor Q4 so as to turn transistor Q4 ON. This, in turn, pulls the output line 43 down. The high condition at node 39 also is applied to the gate of controlled current source transistor Q10 through a gate resistor 44. The high condition at the gate of transistor Q10 causes transistor Q10 to assume an increased current flow condition. Since the high at node 39 is also applied to the gate of transistor Q7, there is a conductive path from line 19 through transistor Q7, through node 18 and through transistor Q10 to the reference voltage Vee, thus charging parasitic capacitor 41. In the reverse condition, when node 39 is in a low logic condition state, the low condition is applied through gate resistor 44 to the gate of controlled current source transistor Q10 so as to place transistor Q10 in the reduced current flow condition state. At the same time, the output line 43 from differential amplifier 42 is in the high condition causing transistor Q9 to assume the increased current flow condition, thus supplying current via line 19 to parasitic capacitor 41 for rapidly discharging parasitic capacitor 41. The reduced current flow condition of transistor Q10 minimizes the power consumption of differential amplifier 17'.

It will now be understood that the transistor Q10 is able to minimize power consumption when the node 39 is in the low logic state, but is unable to minimize the power consumption of differential amplifier 17' when node 39 is in the high logic state. It will be appreciated that by driving the gates of transistors Q9 and Q10 so as to maximize and minimize current flow that there is an improvement in the speed of operation of differential amplifier 17' in both conditions.

Refer now to FIG. 1 and compare the simplicity of FIG. 1 with the enhancement provided in FIG. 4. It will be noted that the pull-up load resistor 21 has been changed to a gate driven current source load transistor Q9 and that the common source resistorf 27 has been changed to a controlled current source transistor Q10. Further, the gate driven current source load transistor Q9 is driven by the output of the enhancement differential amplifier 42. It will be noted that differential amplifier 42 has its input transistors Q3 and Q4 connected to nodes 37 and 39 respectively. When the node 37 goes high, it drives the output line 43 high and when the node 37 goes low, it drives the output line 43 low. The transistor Q8 of differential amplifier 42 is a current source load transistor and the transistor Q5 is a pull-down current source transistor, both of which could be replaced with resistors.

Having explained the preferred embodiment operation of the GaAs to ECL converter shown in FIGS. 1 and 4, it will be appreciated that the ECL load 26 is incapable of distinguishing the type of output driver which is producing the logic signals at node 23. Further, the novel circuitry shown in FIG. 4 is adapted to be implemented on a single GaAs integrated circuit chip with the exception of termination resistor 24. It is entirely possible that in the future termination resistor 24 could be placed on the integrated circuit chip but in the present state of the art, the termination resistor must be accurate within five to ten percent for proper operation and this is not easily accomplished on the GaAs chip. Another reason for placing the termination resistor 24 external to the integrated circuit chip is that termination resistor 24 consumes a large amount of power and it is not desirable to have to dissipate this amount of power on the integrated circuit chip. Another reason for placing the termination resistor 24 external to the GaAs integrated circuit chip having the converter thereon is that the termination resistor 24 may already be an external resistor in an existing ECL system. When GaAs logic circuits are employed to replace such ECL circuits, the substitution becomes one of unplugging ECL and plugging in GaAs with the converters already on the chip.

Having explained the present invention employing preferred voltage logic levels and voltage thresholds as presently employed in the computer industry, it would be expected that other logic voltage levels and threshold voltages may become applicable as the industry continues to provide better and faster devices.

We claim:

1. A gallium arsenide (GaAs) level converter for employing gallium arsenide logic source input signals to drive emitter coupled logic (ECL) circuitry, comprising:
   a non-inverting gallium arsenide logic source input,
   an inverting gallium arsenide logic source input,
   a plurality of series connected gallium arsenide level shifting diodes connected in each said gallium arsenide logic source input,
   a voltage source,
   a first gallium arsenide differential amplifier connected to said voltage source,
   said first gallium arsenide differential amplifier having a non-inverting input transistor whose gate is coupled to said non-inverting gallium arsenide logic source input and having an inverting input transistor whose gate is coupled to the inverting logic source input,
   a resistive pull-up load connected intermediate said voltage source and the drain of said inverting input transistor,
   a low reference voltage,
   a resistive common source impedance connected between the source of said input transistors and said low reference voltage,
   an output line connected to the drain of said inverting input transistor,
   a termination voltage,
   an output load branch having a series connected gallium arsenide transistor, a gallium arsenide level shifting diode and a precision termination resistor connected between said voltage source and said termination voltage,
   said output key being connected to the gate of said output load branch transistor, and
   a converter output line connected intermediate said gallium arsenide diode and said precision termination resistor, whereby said converter output line is provided with a full range of output voltage swings adapted to drive emitter coupled logic loads.

2. A level converter as set forth in claim 1 wherein said precision termination resistor is provided as an external component connected to said gallium arsenide converter.

3. A level converter as set forth in claim 2 wherein said converter output line is connected to a transmission line having a characteristic impedance of approximately 50 ohms.

4. A level converter as set forth in claim 1 wherein said resistive pull-up load comprises a gallium arsenide current source transistor for controlling current in said output load branch.

5. A level converter as set forth in claim 4 which further includes a second gallium arsenide differential amplifier having a pair of input transistors and an output line connected to the gate of said current source load transistor, each of said pair of input transistors having their gates coupled to one of said logic input sources.

6. A level converter as set forth in claim 5 wherein said second gallium arsenide differential amplifier further comprises a gallium arsenide current source load transistor and a current source pull-down transistor.

7. A level converter as set forth in claim 1 wherein said resistive common source impedance comprises a controlled current source transistor.

8. A level converter as set forth in claim 7 wherein said inverting gallium arsenide logic input source is coupled to the gate of said controlled current source transistor.

9. A level converter as set forth in claim 8 wherein a level shifting network comprising said plurality of level shifting diodes and a gallium arsenide current source pull-down transistor is coupled intermediate said inverting gallium arsenide logic input source and the gate of said controlled current source transistor.

10. A level converter as set forth in claim 9 wherein said level shifting network is also coupled intermediate said inverting gallium arsenide logic input source and the gate of said inverting input transistor.

11. A level converter as set forth in claim 8 which further includes a gate resistor coupled intermediate said level shifting network and the gate of said controlled current source transistor.

12. A level converter as set forth in claim 8 wherein a level shifting network comprising said plurality of level shifting diodes and a gallium arsenide current source pull-down transistor are coupled intermediate said non-inverting gallium arsenide logic source input and the gate of said non-inverting input transistor of said first differential amplifier.

* * * * *